(12) United States Patent
Habuta et al.

(10) Patent No.: US 7,972,674 B2
(45) Date of Patent: Jul. 5, 2011

(54) INFORMATION RECORDING MEDIUM, ITS MANUFACTURING METHOD, AND SPUTTERING TARGET FOR FORMING INFORMATION RECORDING MEDIUM

(75) Inventors: Haruhiko Habuta, Osaka (JP); Noboru Yamada, Osaka (JP)

(73) Assignee: Panasonic Corporation, Osaka (JP)

( * ) Notice: Subject to any disclaimer, the term of this patent is extended or adjusted under 35 U.S.C. 154(b) by 233 days.

(21) Appl. No.: 12/439,592

(22) PCT Filed: Oct. 26, 2007

(86) PCT No.: PCT/JP2007/070874
§ 371 (c)(1),
(2), (4) Date: Mar. 2, 2009

(87) PCT Pub. No.: WO2008/053792
PCT Pub. Date: May 8, 2008

(65) Prior Publication Data
US 2009/0258178 A1    Oct. 15, 2009

(30) Foreign Application Priority Data

Nov. 1, 2006 (JP) ................................. 2006-297386

(51) Int. Cl.
*B32B 3/02* (2006.01)
(52) U.S. Cl. ............... 428/64.1; 428/64.4; 428/64.5; 430/270.13
(58) Field of Classification Search .................. None
See application file for complete search history.

(56) References Cited

U.S. PATENT DOCUMENTS

| 4,659,588 A | 4/1987 | Yamada et al. |
| 6,229,785 B1 | 5/2001 | Kitaura et al. |
| 2002/0022105 A1 | 2/2002 | Kitaura et al. |
| 2004/0253539 A1* | 12/2004 | Uno et al. ............ 430/270.13 |
| 2005/0082162 A1 | 4/2005 | Uno et al. |

FOREIGN PATENT DOCUMENTS

| JP | 55-38616 | 3/1980 |
| JP | 58-54338 | 3/1983 |
| JP | 60-9870 | 1/1985 |
| JP | 2002-133712 | 5/2002 |
| JP | 2005-22409 | 1/2005 |
| JP | 2005-135568 | 5/2005 |
| WO | 98/09823 | 3/1998 |

OTHER PUBLICATIONS

International Search Report issued Jan. 29, 2008 in the International (PCT) Application No. PCT/JP2007/070874.

* cited by examiner

*Primary Examiner* — Elizabeth Mulvaney
(74) *Attorney, Agent, or Firm* — Wenderoth, Lind & Ponack, L.L.P.

(57) ABSTRACT

A write-once information recording medium having a high recording sensitivity and reliability with respect to long-term storage is provided. The information recording medium has a recording layer on a substrate, to which information can be recorded and from which information can be reproduced by irradiating the recording layer with laser light or applying electrical energy to the recording layer. The recording layer contains, as its primary components, $TeO_2$ and a material A, where the material A is a material that exhibits a eutectic reaction with $TeO_2$.

18 Claims, 6 Drawing Sheets

INFORMATION RECORDING MEDIUM, ITS MANUFACTURING METHOD, AND SPUTTERING TARGET FOR FORMING INFORMATION RECORDING MEDIUM

TECHNICAL FIELD

The present invention relates to an information recording medium onto which information can be optically recorded and from which information can be optically reproduced, and to a manufacturing method for such an information recording medium.

BACKGROUND ART

Optical information recording media are known as media with which large amounts of information can be recorded and reproduced at high speeds. Optical information recording techniques record by utilizing changes in a recording material into differing optically-distinct states caused by the heat generated when the recording material is irradiated by a laser light. Such recording media have the significant advantages of making it possible for random access when necessary while also being highly transportable, and thus are becoming more and more important in recent times. Rewriteable media, which can be rewritten multiple times, and write-once media, which can only be written once, can be given as types of optical information recording media that have been conventionally proposed.

In general, write-once media often have fewer layers than rewriteable media, making it possible to manufacture the media easily and at low cost. Furthermore, because write-once media cannot be rewritten, they are favorable when writing data that a user does not wish to be destroyed. For these reasons, write-once media, a highly-reliable media whose storage lifespan is long, are in significant demand for archival applications. Demand for write-once media is increasing in various areas, such as, for example, the recording and storage of personal data and video information through computers, use in medical and academic fields, and the replacement of household video tape recorders. Meanwhile, due to the higher performance of applications, an increase in the quality of image information, and so on, even larger capacities and higher speeds are being called for in such recording media.

There is currently a particular increase in demand for writing information at high speeds in order to increase the convenience for consumers who use optical information recording media. Accordingly, it is necessary for the laser used in the recording of the information to be more powerful than before. However, if a laser is to be used in a stable manner over a long period of time, there is a limit to the power that can be introduced to that laser.

Furthermore, when information is recorded onto an optical information recording medium at high power, a greater thermal load is applied to the dielectric layer or the like that makes contact with the recording layer, resulting in a problem that the reliability of the recording medium decreases. In other words, increased sensitivity is desirable from the standpoint of recording medium reliability as well.

Multilayer media, in which information is recorded onto multiple layers, are becoming necessary for the purpose of improving recording density. With multilayer optical information recording media, which have two or more information layers, it is necessary to record data onto the information layers farther from the light entrance surface through the information layers closer to the light entrance surface, and thus a higher recording sensitivity is required. Conversely, it is necessary to reduce the thickness of the recording layers in order to realize a higher transmissibility in the information layers closer to the light entrance surface, and thus recording layers with higher sensitivity are required. Due to such factors, higher sensitivities are being demanded in multilayer recording media that attempt to realize higher capacities.

Based on the above-described background, recording media that have higher sensitivities (that is, that can be recorded to at lower laser powers) are necessary for optical information recording media.

Several oxide materials have been conventionally proposed as write-once recording materials. For example, a recording material that uses TeOx, a Te low oxide, as its primary component is known. Among these, a Te—O—Pd recording material that uses a material in which Pd (Au and Pt can also be used) is dispersed among the TeOx as its primary component achieves a large signal amplitude and is thus known for its extremely high reliability (see Patent Citation 1). However, Te—O—Pd recording materials are problematic in that they cannot achieve a recording sensitivity of the degree required to meet the needs of the higher speeds and larger capacities of the future.

The following can be given as examples in which other materials are added to materials that use TeOx as their primary component in order to improve recording characteristics.

Patent Citation 2 proposes adding at least one compound selected from La—F, Mg—F, Ca—F, a rare-earth element fluoride, Si—O, Cr—O, Ge—O, Hf—O, Mo—O, Ti—O, W—O, Zn—O, and Zr—O to TeOx in order to obtain a higher signal quality by preventing thermal diffusion within the recording film surface in the case where a violet wavelength laser and an objective lens with an NA of 0.80 or more are used. While an improvement in the signal quality is obtained in such a case, there is no discussion of an improvement in the recording sensitivity.

Furthermore, although Patent Citation 3 discusses improving recording sensitivity by adding TlOx, a low-melting point material, this conventional technique provides insufficient effects with regards to increasing the sensitivity when recording information onto an optical information recording medium. In addition, although this patent citation also proposes increasing the change in the refractive index by adding BiOx, InOx, or the like, thereby increasing the optical change, the effect thereof on the recording sensitivity is not discussed.

Patent Citation 1: International Publication WO 98/09823
Patent Citation 2: JP 2005-22409A
Patent Citation 3: JP S55-38616A

DISCLOSURE OF INVENTION

Technical Problem

The present invention solves the aforementioned conventional problems, and it is an object thereof to provide an information recording medium that has high recording sensitivity and is highly reliable with respect to long-term storage.

Technical Solution

The information recording medium according to one aspect of the present invention is an information recording medium having a recording layer on a substrate, the information recording medium to which information can be recorded and from which information can be reproduced by irradiating the recording layer with laser light or applying electrical energy to the recording layer. The recording layer contains $TeO_2$ and a material A as its primary component, and the material A is a material that exhibits a eutectic reaction with $TeO_2$. Through this, the power of the laser used when recording information can be made highly sensitive, and an information recording medium that is highly reliable with respect to long-term storage can be realized.

It is favorable for the material A to include an oxide, as this makes it possible to make the power of the laser used when recording information highly sensitive.

It is favorable for the material A to include at least one of Ag—O, Al—O, B—O, Bi—O, Ce—O, Cu—O, Ga—O, In—O, Mo—O, Nb—O, and V—O, as this increases the effects of improving the recording sensitivity.

Because Al—O, Bi—O, Ga—O, In—O, Mo—O, Nb—O, and V—O have good chemistry with Te—O, it is favorable for the material A to include at least one of those compounds, as doing so makes it particularly easy to increase the sensitivity and improve the reliability.

The information recording medium according to another aspect of the present invention is an information recording medium having a recording layer on a substrate, the information recording medium to which information can be recorded and from which information can be reproduced by irradiating the recording layer with laser light or applying electrical energy to the recording layer. The recording layer contains Te, M (where M is one or more elements selected from Au, Pd, and Pt), $TeO_2$ and a material A as its primary component, and the percentage of content of Te atoms is no less than 0 mol % and no more than 40 mol %, the percentage of content of M atoms is no less than 0 mol % and no more than 40 mol %, and the percentage of content of TeO2+ material A is no less than 40 mol % and no more than 85 mol %. With such a medium, it is easy to ensure recording characteristics such as jitter and recording sensitivity, as well as reliability.

It is favorable for the material A to be $Ag_2O$, and the $Ag_2O/TeO_2$ ratio to be no less than 0.18 and no more than 1.00, as the melting point of the recording layer decreases to improve the recording sensitivity and reliability.

It is favorable for the material A to be $Al_2O_3$, and the $Al_2O_3/TeO_2$ ratio to be no less than 0.10 and no more than 0.50, as the melting point of the recording layer decreases to improve the recording sensitivity and reliability.

It is favorable for the material A to be $B_2O_3$, and the $B_2O_3/TeO_2$ ratio to be no less than 0.18 and no more than 0.33, as the melting point of the recording layer decreases to improve the recording sensitivity and reliability.

It is favorable for the material A to be $Bi_2O_3$, and the $Bi_2O_3/TeO_2$ ratio to be no less than 0.04 and no more than 0.30, as the melting point of the recording layer decreases to improve the recording sensitivity and reliability.

It is favorable for the material A to be $CeO_2$, and the $CeO_2/TeO_2$ ratio to be no less than 0.05 and no more than 0.14, as the melting point of the recording layer decreases to improve the recording sensitivity and reliability.

It is favorable for the material A to be CuO, and the $CuO/TeO_2$ ratio to be no less than 0.10 and no more than 1.00, as the melting point of the recording layer decreases to improve the recording sensitivity and reliability.

It is favorable for the material A to be $Cu_2O$, and the $Cu_2O/TeO_2$ ratio to be no less than 0.05 and no more than 1.00, as the melting point of the recording layer decreases to improve the recording sensitivity and reliability.

It is favorable for the material A to be $Ga_2O_3$, and the $Ga_2O_3/TeO_2$ ratio to be no less than 0.05 and no more than 0.18, as the melting point of the recording layer decreases to improve the recording sensitivity and reliability.

It is favorable for the material A to be $In_2O_3$, and the $In_2O_3/TeO_2$ ratio to be no less than 0.02 and no more than 0.08, as the melting point of the recording layer decreases to improve the recording sensitivity and reliability.

It is favorable for the material A to be $MoO_3$, and the $MoO_3/TeO_2$ ratio to be no less than 0.25 and no more than 1.50, as the melting point of the recording layer decreases to improve the recording sensitivity and reliability.

In addition, it is favorable for the material A to be $Nb_2O_5$, and the $Nb_2O_5/TeO_2$ ratio to be no less than 0.05 and no more than 0.12, as the melting point of the recording layer decreases to improve the recording sensitivity and reliability.

In addition, it is favorable for the material A to be $VO_2$, and the $VO_2/TeO_2$ ratio to be no less than 0.10 and no more than 0.33, as the melting point of the recording layer decreases to improve the recording sensitivity and reliability.

In the present invention, it is favorable for the information recording medium to comprise n information layers (where n is an integer of 2 or more) formed upon the substrate and interspersed with separating layers, with at least one of the information layers including the recording layer, as this increases the effect of improving the recording sensitivity.

In addition, it is favorable for the thickness of the recording layer to be no less than 2 nm and no more than 30 nm, as this makes it possible to obtain a sufficient optical change and thus ensure good recording characteristics.

The manufacturing method for the information recording medium according to another aspect of the present invention is a manufacturing method comprising a step of creating a recording layer on a substrate, for manufacturing an information recording medium to which information can be recorded and from which information can be reproduced by irradiating the recording layer with laser light or applying electrical energy to the recording layer. In this manufacturing method, the recording layer is manufactured through sputtering, and the target material used in the step of manufacturing the recording layer has, as its primary component, a mixture of Te—O-M (where M is one or more elements selected from Au, Pd, and Pt) and a material A (where the material A is a material that exhibits a eutectic reaction with Te—O).

The manufacturing method for the information recording medium according to yet another aspect of the present invention is a manufacturing method comprising a step of creating a recording layer on a substrate, for manufacturing an information recording medium to which information can be recorded and from which information can be reproduced by irradiating the recording layer with laser light or applying electrical energy to the recording layer. In this manufacturing method, the recording layer is manufactured through sputtering. Reactive sputtering is performed, with the target material used in the step of manufacturing the recording layer having, as its primary component, a mixture of Te-M (where M is one or more elements selected from Au, Pd, and Pt) and a material B (where the material A, which is an oxide of the material B, being a material that exhibits a eutectic reaction with Te—O), and with the deposition gas has, as its primary component, a mixture of a rare gas and oxygen.

The manufacturing method for the information recording medium according to yet another aspect of the present invention is a manufacturing method comprising a step of creating a recording layer on a substrate, for manufacturing an information recording medium to which information can be recorded and from which information can reproduced by irradiating the recording layer with laser light or applying electrical energy to the recording layer. In this manufacturing method, the recording layer is manufactured through sputtering, and in the step of manufacturing the recording layer, a compound of Te-M (where M is one or more elements selected from Au, Pd, and Pt), Te—O, and the material A (where the material A is a material that exhibits a eutectic reaction with Te—O) are sputtered from differing targets simultaneously.

The sputtering target of the present invention contains $TeO_2$ and a material A as its primary component, and the material A is a material that exhibits a eutectic reaction with $TeO_2$.

The sputtering target of the present invention contains Te and a material B as its primary component, and an oxide of the material B is a material that exhibits a eutectic reaction with $TeO_2$.

ADVANTAGEOUS EFFECTS

In an information recording medium according to the present invention, a recording layer has a moderate optical absorptivity in at least the blue wave range in the vicinity of 405 nm. Furthermore, as this recording layer contains a material that exhibits a eutectic reaction to $TeO_2$, information can be recorded at a lower temperature than when using a $TeO_2$-based recording layer, making it possible to reduce thermal damage to the dielectric layers on both sides of the recording layer. Accordingly, the application of this recording layer material makes it possible to realize an information recording medium having a favorable recording sensitivity and a high reliability with regards to long-term storage. Furthermore, according to the manufacturing method of an information recording medium of the present invention, an information recording medium that exhibits the effects described above can be manufactured.

Figure 1:
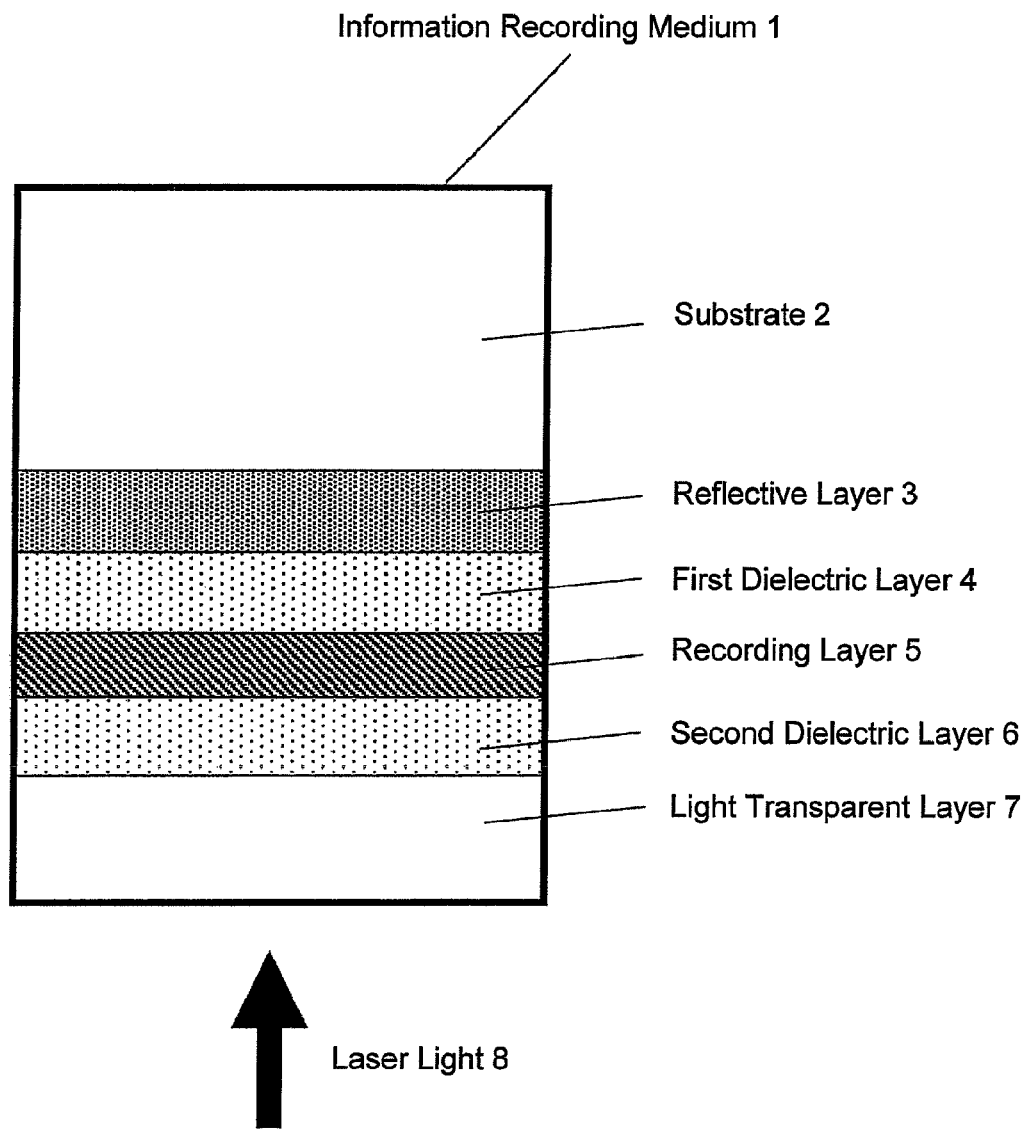
FIG. 1 is a cross-section illustrating an example of the configuration of an optical information recording medium according to the present invention.

EXPLANATION OF REFERENCE 1, 9, 24, 44 information recording medium
2, 10, 25 substrate
4, 12, 18, 27, 32, 37 first dielectric layer
5, 13, 19, 28, 33, 38 recording layer
7, 22, 41 light transparent layer
8, 23, 42, 45 laser light
3, 11, 17, 26 reflective layer
6, 14, 20, 29, 34, 39 second dielectric layer
15, 30 first information layer
16, 31, 36 intermediate layer
21, 35 second information layer
40 nth information layer
43 recording/reproducing device
46 objective lens
47 laser
48 photodetector
49 spindle motor

BEST MODE FOR CARRYING OUT THE INVENTION

Embodiments of the present invention shall be described hereinafter with reference to the drawings. It should be noted that the embodiments described hereinafter are merely exemplary, and the present invention is not limited thereto. Note also that in the following embodiments, there are cases where identical elements are given identical reference numerals and redundant descriptions thereof are omitted.

Figure 2:
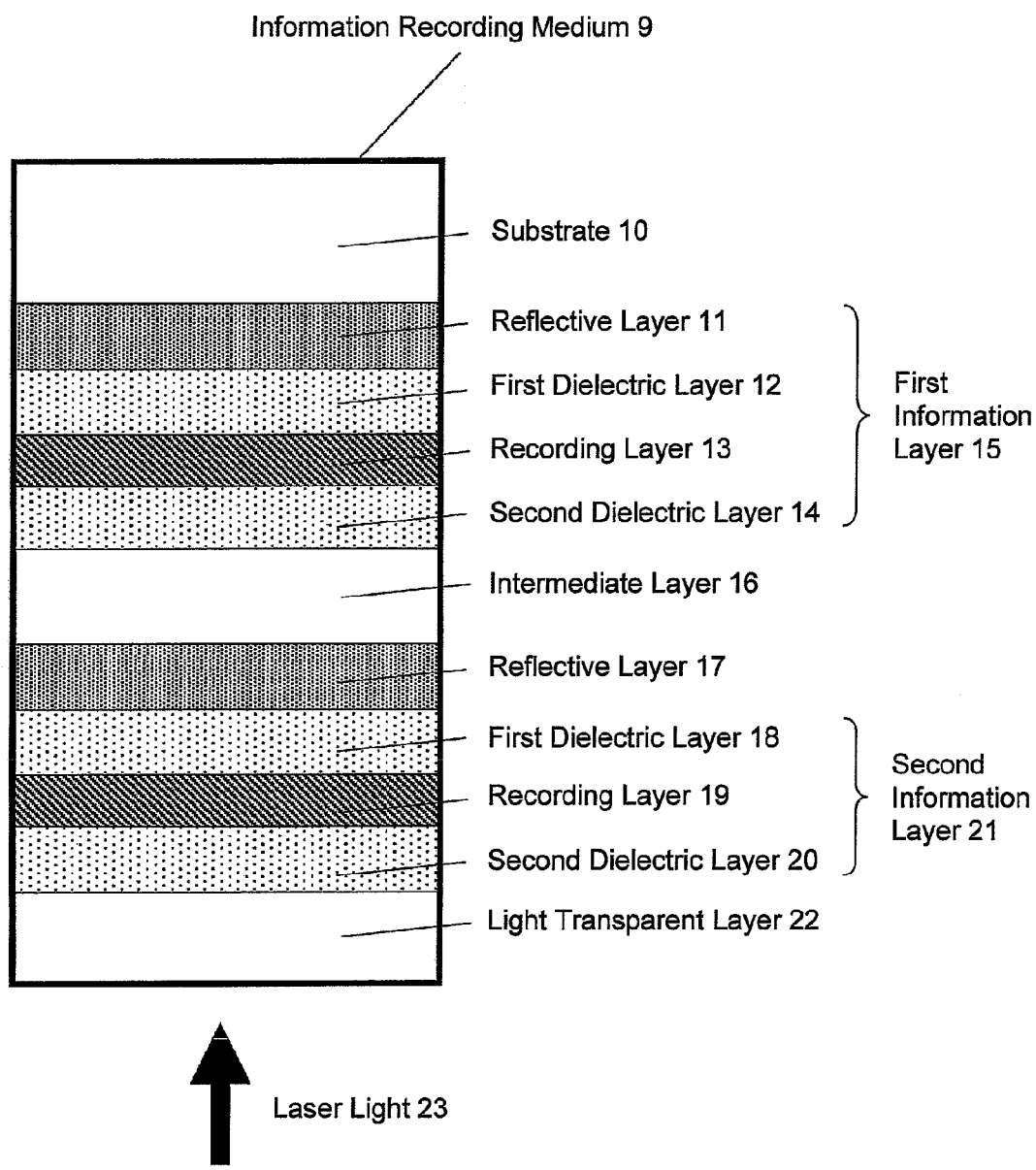
FIG. 2 is a cross-section illustrating an example of the configuration of an optical information recording medium according to the present invention.
Figure 3:
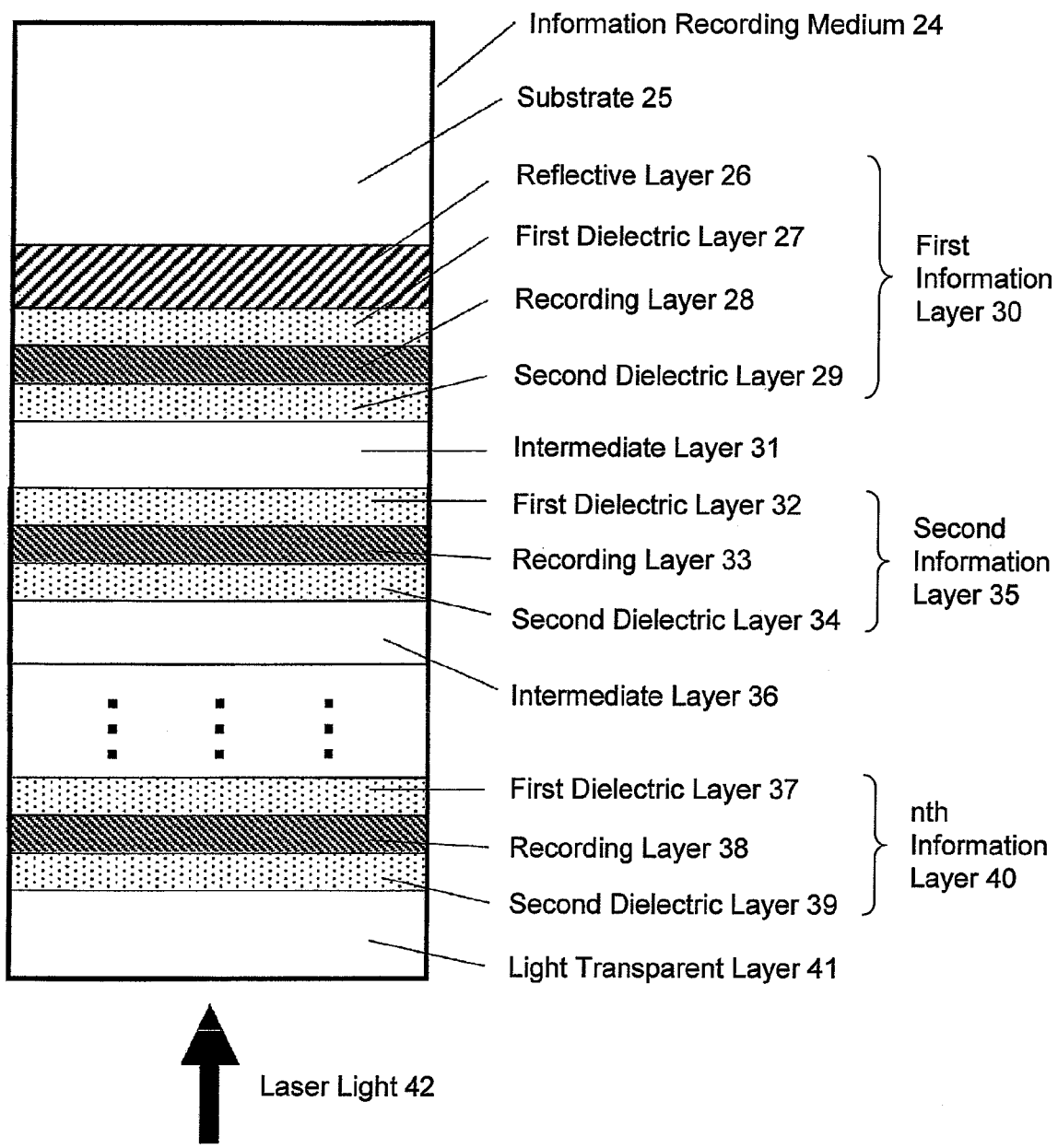
FIG. 3 is a cross-section illustrating an example of the configuration of an optical information recording medium according to the present invention.

FIGS. 1, 2, and 3 are examples of the configuration of an information recording medium according to the present invention.

(Information Recording Medium Illustrated in FIG. 1)

As shown in FIG. 1, an information recording medium 1 according to the present invention has a substrate 2 and an information layer provided thereupon. The information layer include a reflective layer 3, a first dielectric layer 4, a recording layer 5, and a second dielectric layer 6. A light transparent layer 7 is formed upon the information layer. The reflective layer 3, first dielectric layer 4, and second dielectric layer 6 may be omitted as appropriate to reduce costs as long as doing so does not affect the recording characteristics or the like. Recording/reproduction to/from this information recording medium is performed by irradiating the medium with laser light 8 from the side on which the light transparent layer 7 is present.

(Information Recording Medium Illustrated in FIG. 2)

Meanwhile, as shown in FIG. 2, an information recording medium 9 according to the present invention has a substrate 10, and a first information layer 15 and a second information layer 21 provided upon the substrate 10 in that order. An intermediate layer 16 is provided between the two information layers, optically separating the information layers from each other and thereby eliminating unnecessary optical interference. A light transparent layer 22 is formed upon the second information layer 21. Recording/reproduction to/from this information recording medium is performed by irradiating the medium with laser light 23 from the side on which the light transparent layer 22 is present. In order to realize both a high reflectance and high signal quality, the first information layer 15 is structured with a reflective layer 11, a first dielectric layer 12, a recording layer 13, and a second dielectric layer 14 laminated together in that order. Like the first information layer, the second information layer 21 is configured of a reflective layer 17, a first dielectric layer 18, a recording layer 19, and a second dielectric layer 20. However, with respect to realizing both a high transmissibility and high signal quality, the thicknesses of the recording layer and the reflective layer of the second information layer 21 may be formed so as to be thinner than those in the first information layer. The reflective layers, first dielectric layers, and second dielectric layers in the first and second information layers may be omitted as appropriate to reduce costs as long as doing so does not affect the recording characteristics or the like.

(Information Recording Medium Illustrated in FIG. 3)

Finally, as shown in FIG. 3, an information recording medium 24 according to the present invention is configured of a first information layer 30, a second information layer 35, and so on up to an nth information layer 40 (where $n \geq 3$) provided in that order upon a substrate 25. Intermediate layers are provided between the information layers, optically separating the information layers from one another and thereby eliminating unnecessary optical interference. Recording/reproduction to/from this optical information recording medium 24 is performed by irradiating the medium with laser light 42 from the side on which a light transparent layer 41 is present. In order to realize both a high reflectance and high signal quality, the first information layer 30 is structured with a reflective layer 26, a first dielectric layer 27, a recording layer 28, and a second dielectric layer 29 laminated together in that order. In order to realize both a high transmissibility and high signal quality, the second information layer 35 to the nth information layer 40 are each configured of a first dielectric layer, a recording layer, and a second dielectric layer. A reflective layer may be inserted between the first dielectric layer and the intermediate layer as appropriate in order to increase the signal quality. The reflective layers, first dielectric layers, and second dielectric layers in the respective information layers may be omitted as appropriate to reduce costs as long as doing so does not affect the recording characteristics or the like.

(Details Shared by Each Information Recording Medium)

Because the information layers configured of the recording layers according to the present invention primarily aim to improve the recording sensitivity, it is favorable to apply the present invention to all of the recording layers illustrated in FIGS. 1 to 3. However, in cases such as where the recording sensitivities of each layer in a multilayer medium are to be adjusted with respect to one another, the medium may include both layers to which the present invention has been applied and layers to which the present invention has not been applied.

A transparent, disk-shaped polycarbonate resin, polymethyl methacrylate resin, polyolefin resin, norbornene resin, ultraviolet ray-curable resin, glass, or combination of these can be used as the material for the substrates 2, 10, and 25. The thicknesses of the substrates 2, 10, and 25 are not particularly limited, and substrates from approximately 0.01 to 1.5 mm can be used.

As the material for the light transparent layers 7, 22, and 41, it is favorable for the light absorption thereof with respect to the wavelength of the laser lights 8, 23, and 42 used to be low, and for the birefringence to be optically low in the short wave range; therefore, a transparent, disk-shaped polycarbonate resin, polymethyl methacrylate resin, polyolefin resin, norbornene resin, ultraviolet ray-curable resin, glass, or combination of these can be used as this material. The thicknesses of the light transparent layers 7, 22, and 41 are not particularly limited, and layers from approximately 0.01 to 1.5 mm can be used.

In the case where the numerical aperture of the objective lens is 0.75 to 0.95, it is favorable for the substrates 2, 10, and 25 to be in the range of 1.00 to 1.20 mm thick in order to maintain strength during disk manufacture, and it is furthermore favorable for the light transparent layers 7, 22, and 41 to be in the range of 0.03 mm to 0.20 mm thick in order to reduce the allowable width with respect to tilt.

However, in the case where the numerical aperture of the objective lens is 0.55 to 0.75, it is favorable for the substrates 2, 10, and 25 to be in the range of 0.50 to 0.70 mm thick, and for the light transparent layers 7, 22, and 41 to be in the range of 0.50 mm to 0.70 mm thick.

A transparent, disk-shaped polycarbonate resin, polymethyl methacrylate resin, polyolefin resin, norbornene resin, ultraviolet ray-curable resin, glass, or combination of these can be used as the material for the intermediate layers 16, 31, and 36, in the same manner as the light transparent layers. In order to reduce crosstalk with other layers when reproducing information from one of the first information layer, the second information layer, and the nth information layer, it is necessary for the thicknesses of the intermediate layers 16, 31, and 36 to be greater than or equal to the focal depth determined by the numerical aperture NA of the objective lens and the wavelength $\lambda$ of the laser light, and of a thickness with which all information layers fall within a range in which light can be condensed. In the case where three or more information layers are laminated together, it is favorable for the respective intermediate layers to have different thicknesses. This is because if the intermediate layers are of the same thickness, the information layers are positioned at equal intervals, and thus when recording to/reproducing from a layer of a certain depth, the laser light may be condensed upon a layer positioned two places before that layer, which can lead to an increase in crosstalk.

It is favorable for guidance grooves or pits for guiding the laser light to be formed in at least one of the substrates 2, 10, and 25, the light transparent layers 7, 22, and 41, and the intermediate layers 16, 31, and 36, on the sides thereof on which the information layer is positioned.

The recording layers 5, 13, 19, 28, 33, and 38 are configured of a material capable of taking on two or more differing states of optical characteristics. It is favorable for the material of the recording layers to be capable of irreversibly changing between these differing states. To be more specific, this material is made up of a mixture of Te—O-M (where M is one element or multiple elements selected from Au, Pd, and Pt) and a material A.

According to the recording layers 5, 13, 19, 28, 33, and 38 of the present embodiment, the energy required to crystallize the recording layer material can be less than is conventionally required, making it possible to increase the sensitivity of the laser power when recording information, and making it possible to realize an information recording medium that is highly reliable with respect to long-term storage.

Te—O-M is a composite material in which fine particles of Te, Te-M, and M are uniformly dispersed throughout $TeO_2$ immediately following the deposition, and the crystal particle diameter of Te and Te-M increases due to the irradiation of laser light. Differences in optical states at this time can be detected as signals, making it possible to realize what is known as a write-once recording medium, where information can be written to the medium only once.

The element M is added to accelerate the Te crystallization, which can be obtained as long as M is an element that can form a bond with Te, such as Au, Pd, and Pt. Because elements such as Au, Pd, and Pt are precious metals which do not bond well with oxygen but do bond well with Te, they are particularly desirable elements.

In Te—O-M, when the element M content is taken as x at % and the Te content is taken as y at %, it is favorable for the element M to be added so as to fulfill the x-y relationship $0.05y \leq x \leq y$. This is because having $x \leq y$ makes it possible to obtain a sufficient amount of change in the optical characteristics, and having $0.05y \leq x$ makes it possible to effectively obtain an improvement in crystallization speed.

The material A is a material added primarily to reduce the melting point of the recording layers 5, 13, 19, 28, 33, and 38, and is a material that exhibits a eutectic reaction with Te—O. A material that contains an oxide is particularly favorable as the material A.

Figure 5:
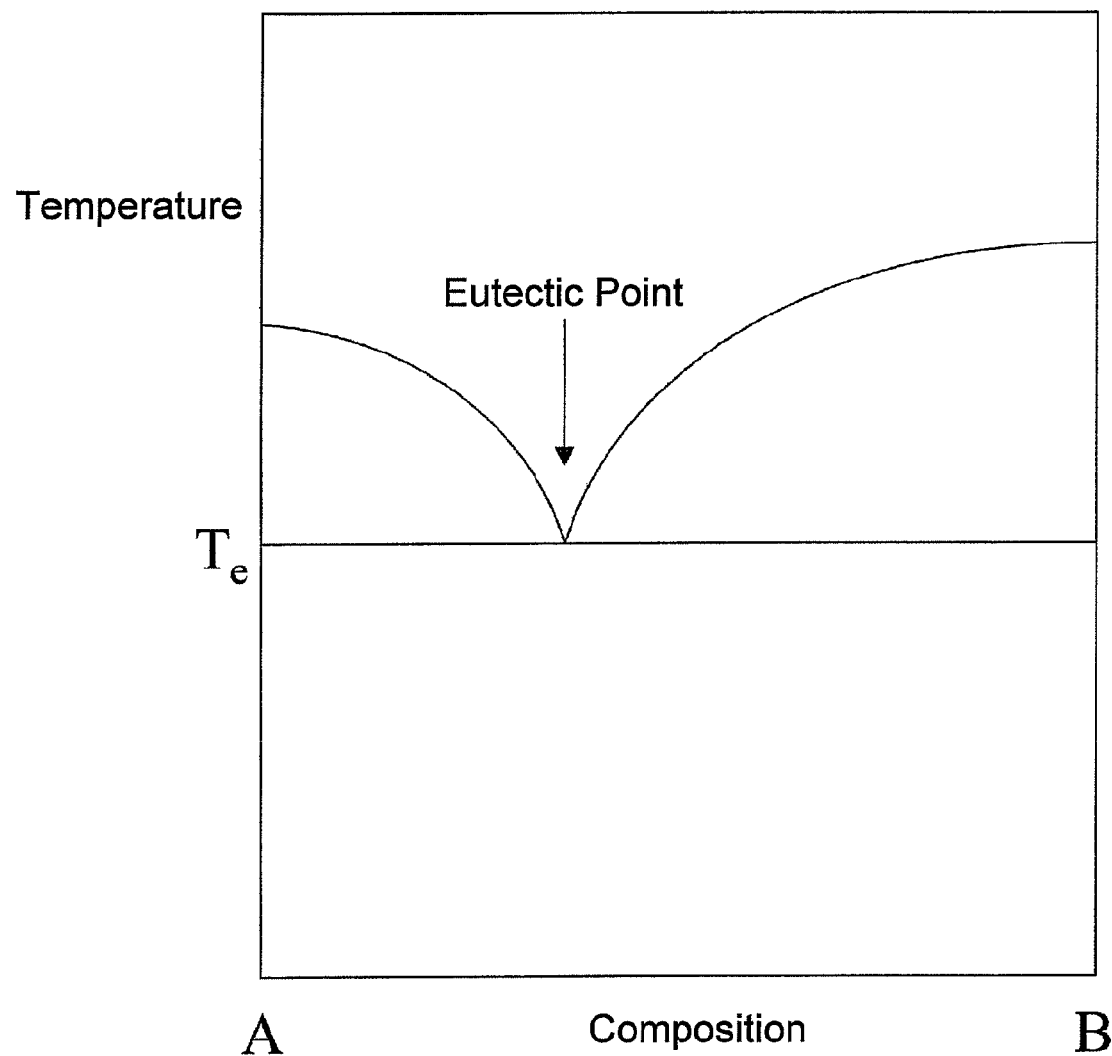
FIG. 5 is a phase diagram of a typical eutectic material.

"Eutectic reaction" refers to a reaction whereby a single liquid separates during cooling into two different solids. FIG. 5 is a phase diagram illustrating an example in which two components, or A and B, blend as liquids, but do not intermingle at crystallization. When a solution having a composition corresponding to the melting point minimum value Te is cooled, the temperature is held constant at Te until all of the solution has crystallized, as if the solution was a pure liquid. The eutectic is a mechanical mixture of two types of crystals, or A and B, but maintains a constant temperature when melted, exhibiting melting behavior similar to that of a pure crystal.

The following methods can be considered when adding an additional material in order to reduce the melting point of a given material:

(1) Add an additional material having a lower melting point.

(2) Add an additional material that exhibits a eutectic reaction with the original material.

With the former, melting point reduction effects are obtained in proportion to the amount added, and thus it is necessary to add a greater amount in order to sufficiently reduce the melting point. This significantly changes the characteristics of the original material. However, because the latter has a compositional range in which the melting point drops locally, a sufficient reduction in the melting point can be obtained even with a small amount of added material. For this reason, (2) can reduce the melting point without significantly changing the characteristics of the original material.

As described earlier, the write-once recording material Te—O-M is a composite material in which fine particles of Te, Te-M, and M are uniformly dispersed throughout $TeO_2$ immediately following the deposition. Based on experimentation on the part of the inventors, it was understood that the melting point of the recording layers 5, 13, 19, 28, 33, and 38 could be reduced immediately following deposition by adding the material A to the recording material Te—O-M. It is assumed that this is because while the melting point of $TeO_2$ is in the vicinity of 730° C., the melting point drops when a material exhibiting a eutectic reaction with $TeO_2$ is added.

The material A was determined by referring to binary phase diagrams for oxides. "Phase Diagrams for Ceramists" (The American Ceramic Society) can be given as an example of an authoritative publication on binary phase diagrams for oxides.

TABLE 1

| Additional Material | Eutectic Composition (1) | Melting Point of Eutectic Composition (1) | Eutectic Composition (2) | Melting Point of Eutectic Composition (2) | Max. Added Amount |
|---|---|---|---|---|---|
| Ag2O | 30.0% | 437° C. | — | — | 50.0% |
| Al2O3 | 15.0% | 675° C. | 31.3% | 650° C. | 34.0% |
| B2O3 | 25.5% | 680° C. | — | — | 26.0% |
| Bi2O3 | 13.0% | 575° C. | — | — | 24.0% |
| CeO2 | 9.0% | 689° C. | — | — | 13.0% |
| CuO | 18.5% | 600° C. | 45.0% | 615° C. | 50% |
| Cu2O | 18.0% | 550° C. | 35.0% | 577° C. | 50% |
| Ga2O3 | 10.0% | 630° C. | — | — | 18.0% |
| In2O3 | 5.0% | 610° C. | — | — | 9.0% |
| MoO3 | 32.5% | 543° C. | 44.5% | 526° C. | 77.0% |
| Nb2O5 | 8.0% | 690° C. | — | — | 15.0% |
| VO2 | 18.0% | 615° C. | — | — | 47.0% |

Figure 6:
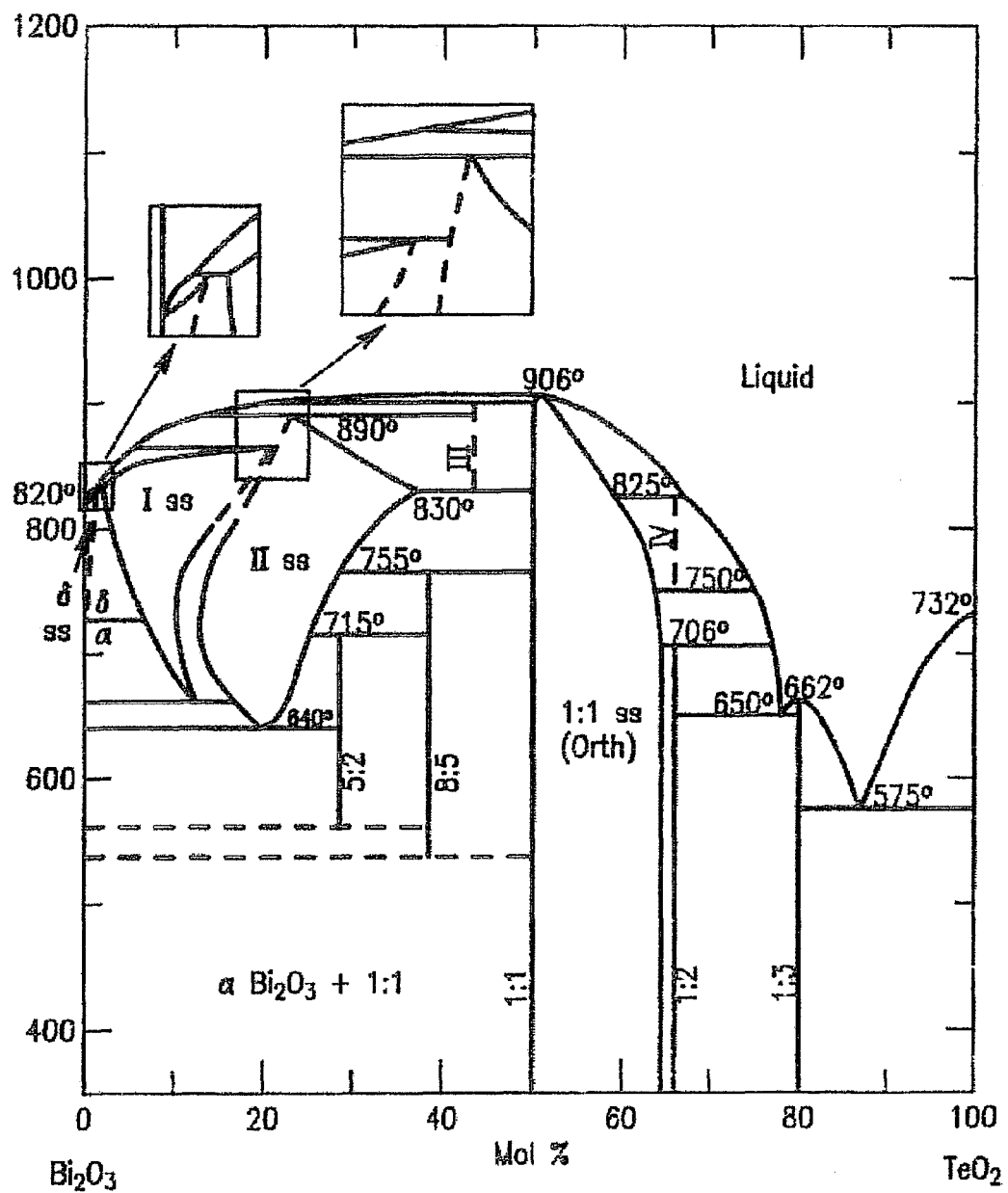
FIG. 6 is a phase diagram of a $TeO_2$—$Bi_2O_3$ system.

Table 1 shows materials that exhibit a eutectic reaction when added to $TeO_2$. As illustrated in Table 1, some materials have two types of eutectic composition. Table 1 summarizes, for each of the materials, the percentage of added material (with respect to $TeO_2$) in the eutectic composition, the melting point of the eutectic composition, and the maximum added amount (the maximum amount at which the melting point decreases relative to the melting point of 732° C. of $TeO_2$ by adding the material). Meanwhile, FIG. 6 illustrates a phase diagram of $TeO_2$—$Bi_2O_3$. This diagram shows that the eutectic point of a $TeO_2$—$Bi_2O_3$ system occurs when $Bi_2O_3$ is at 13.0%, and the meting point of the eutectic composition is 575° C. Table 1 summarizes this information for other materials as well.

Ag—O, Al—O, B—O, Bi—O, Ce—O, Cu—O, Ga—O, Ge—O, In—O, Mo—O, Nb—O, V—O, and so on can be used as the material A. Of these, Al—O, Bi—O, Ga—O, In—O, Mo—O, Nb—O, and V—O are particularly favorable due to the ease at which both an increase in sensitivity and an improvement in reliability.

In the case where the recording layer is composed of a mixture of Te, M (where M is one or more elements selected from Au, Pd, and Pt), $TeO_2$, and the material A, it is favorable for the composition thereof to be as follows:

Percentage of content of Te atoms is no less than 0 mol % and no more than 40 mol %; percentage of content of M atoms is no less than 0 mol % and no more than 40 mol %; percentage of content of $TeO_2$+ material A is no less than 40 mol % and no more than 85 mol %.

In particular, it is favorable for the following to be true: when the material A is $Ag_2O$, the $Ag_2O/TeO_2$ ratio is no less than 0.18 and no more than 1.00; when the material A is $Al_2O_3$, the $Al_2O_3/TeO_2$ ratio is no less than 0.10 and no more than 0.50; when the material A is $B_2O_3$, the $B_2O_3/TeO_2$ ratio is no less than 0.18 and no more than 0.33; when the material A is $Bi_2O_3$, the $Bi_2O_3/TeO_2$ ratio is no less than 0.04 and no more than 0.30; when the material A is $CeO_2$, the $CeO_2/TeO_2$ ratio is no less than 0.05 and no more than 0.14; when the material A is CuO, the $CuO/TeO_2$ ratio is no less than 0.10 and no more than 1.00; when the material A is $Cu_2O$, the $Cu_2O/TeO_2$ ratio is no less than 0.05 and no more than 1.00; when the material A is $Ga_2O_3$, the $Ga_2O_3/TeO_2$ ratio is no less than 0.05 and no more than 0.18; when the material A is $In_2O_3$, the $In_2O_3/TeO_2$ ratio is no less than 0.02 and no more than 0.08; when the material A is $MoO_3$, the $MoO_3/TeO_2$ ratio is no less than 0.25 and no more than 1.50; when the material A is $Nb_2O_5$, the $Nb_2O_5/TeO_2$ ratio is no less than 0.05 and no more than 0.12; and when the material A is $VO_2$, the $VO_2/TeO_2$ ratio is no less than 0.10 and no more than 0.33.

As the melting point increases for $TeO_2$+ material A compositions falling outside of this range, effects of improving recording sensitivity cannot be obtained.

It is favorable for the recording layers 5, 13, 19, 28, 33, and 38 to be greater than or equal to 2 nm and less than 30 nm in thickness. The reason for this is that having a thickness greater than or equal to 2 nm makes it easy for the recording material to take on layer form, and thus a favorable signal can be obtained. However, a thickness greater than 30 nm is not favorable because it results in a drop in the transmissibility of the information layer, making it difficult to apply the layer to a multilayer medium. Furthermore, having a thickness less than 30 nm makes it possible to obtain sufficient effects with regards to improving the recording sensitivity.

The recording layers 5, 13, 19, 28, 33, and 38 can also be configured by alternately laminating a film whose primary component is Te—O-M to a film whose primary component is the material A. Although doing so does increase the number of steps required for manufacture, the mixture ratio of Te—O-M and the material A can be adjusted with ease by making minute adjustments to the respective film thicknesses, and thus using such a configuration as appropriate can be favorable depending on the case.

The recording layers 5, 13, 19, 28, 33, and 38 may include elements aside from Te, O, M, and the material A. For example, at least one element selected from S, N, F, B, and C may be added in order to adjust the thermal conductivity or optical constant, or to improve the heat resistance/environmental reliability or the like. It is favorable for these added elements to be within 20 atom % of the overall recording layer.

It is further favorable to apply the recording layer to at least one of the layers in the multilayer information recording media shown in FIGS. 2, 3, and so on. The reason for this is that in a multilayer information recording medium, it is necessary to record/reproduce information by passing through information layers located on the side of the medium on which the laser light enters, and therefore a recording layer with a higher sensitivity is necessary.

The first dielectric layers 4, 12, 18, 27, 32, and 37, and the second dielectric layers 6, 14, 20, 29, 34, and 39 are provided primarily to protect the recording material and to adjust the optical properties; that is, to make effective light absorption possible in the information layers. A sulfide such as ZnS, a selenide such as ZnSe, an oxide such as Si—O, Al—O, Ti—O, Ta—O, Zr—O, or Cr—O, a nitride such as Ge—N, Cr—N, Si—N, Al—N, Nb—N, Mo—N, Ti—N, Zr—N, or Ta—N, a nitride oxide such as Ge—O—N, Cr—O—N, Si—O—N, Al—O—N, Nb—O—N, Mo—O—N, Ti—O—N, Zr—O—N, or Ta—O—N, a carbide such as Ge—C, Cr—C, Si—C, Al—C, Ti—C, Zr—C, or Ta—C, a fluoride such as Si—F, Al—F, Ca—F, or La—F, or an appropriate combination of these materials (for example, $ZnS$—$SiO_2$) can be used as the material for the stated dielectric layers.

It is favorable for the first dielectric layers and the second dielectric layers to be no less than 1 nm thick and no more than 60 nm thick. This is to make it easy to obtain a sufficient C/N ratio with respect to recording/reproducing characteristics.

The reflective layers 3, 11, 17, and 26 are provided in order to obtain heat dissipation effects, optical effects such as the effective absorption of light in the recording layers, and so on. Metals such as Au, Ag, Cu, Al, Ni, Cr, and Ti or alloys composed of appropriately-selected metals may be used as the materials for the reflective layers; however, an Ag alloy, an Al alloy, or the like is favorable. In particular, from the standpoint of heat dissipation and humidity resistance, it is favorable to use an Ag—Pd—Cu alloy, an Ag—Ga—Cu alloy, or the like as the material for the reflective layers. It is favorable for the reflective layers 3, 11, 17, and 26 to be no less than 1 nm thick. The reason for this is that if the reflective layers are less than 1 nm thick, it is difficult for the film to take on a uniform layer form, and thus the thermal and optical effects will be reduced.

Although the first information layer 15 and the second information layer 21 shown in FIG. 2 are both configured having reflective layers, they may be configured without reflective layers in order to reduce costs, increase the transmissibility, and so on. Meanwhile, although only the first information layer 30 shown in FIG. 3 is configured having the reflective layer 26, the second information layer 35 to the nth information layer 40 may also have reflective layers, or alternatively, the first information layer 30 may be configured without the reflective layer 26. Generally, providing a reflective layer decreases the transmissibility of the information layer, but a high signal quality can easily be obtained due to the heat dissipation and optical effects described above. For this reason, it is necessary to design the second information layer 21 shown in FIG. 2 and the second information layer 35 to the nth information layer 40 shown in FIG. 3, all of which are located on the side of the medium on which laser light enters, with or without a reflective layer as appropriate. In the case where a reflective layer is provided, it is necessary to perform a process for making that layer extremely thin, such as no more than 10 nm, in order to ensure the high transmissibility of the information layer. More favorable ranges for n and k are less than 2.0 for the former and no less than 2.0 for the latter.

The stated thin films can be formed through such vapor-phase thin film deposition methods as vacuum deposition, sputtering, ion plating, CVD (Chemical Vapor Deposition), MBE (Molecular Beam Epitaxy), and the like.

Descriptions shall now be given regarding a manufacturing order of the various layers. In the case of the information recording medium shown in FIG. 1, the reflective layer 3, first dielectric layer 4, recording layer 5, and second dielectric layer 6 are deposed in order upon the substrate 2, and the light transparent layer 7 is then formed on top of all of those layers. The method for forming the light transparent layer 7 may be any of the following three methods:

a medium manufactured as far as the second dielectric layer 6 and a backing (the light transparent layer 7) having an adhesive resin on one side are bonded together;

a medium manufactured as far as the second dielectric layer 6 and a sheet-form backing (the light transparent layer 7) are bonded together using a UV resin; and the light transparent layer 7 is formed upon a medium manufactured as far as the second dielectric layer 6 using an ultraviolet ray-curable resin.

The information recording media shown in FIGS. 2 and 3 can also be manufactured in a similar manner by providing steps for deposition as well as steps forming the intermediate layers and light transparent layers.

In particular, one of the following methods can be used in deposition for the stated recording layers.

It is favorable for the recording layer to be manufactured through sputtering, and for the target material used in the step of manufacturing the recording layer to have as its primary component a mixture of Te—O-M (where M is one or more elements selected from Au, Pd, and Pt) and the material A (where the material A is a material that exhibits a eutectic reaction with Te—O). In addition, reactive sputtering may be performed, with the target material having as its primary component a mixture of Te-M (where M is one or more elements selected from Au, Pd, and Pt) and a material B (where the material A, which is an oxide of the material B, is a material that exhibits a eutectic reaction with Te—O), and with the deposition gas having as its primary component a gas that is a mixture of a rare gas and oxygen. Moreover, a compound of Te-M (where M is one or more elements selected from Au, Pd, and Pt), Te—O, and the material A (where the material A is a material that exhibits a eutectic reaction with Te—O) may be sputtered from differing targets simultaneously. Using one of these methods for deposition results in a eutectic reaction between $TeO_2$ and the material A, and is favorable because recording can be performed at high sensitivity.

Next, an example of a recording/reproduction method for an information recording medium according to the present invention shall be described.

Figure 4:
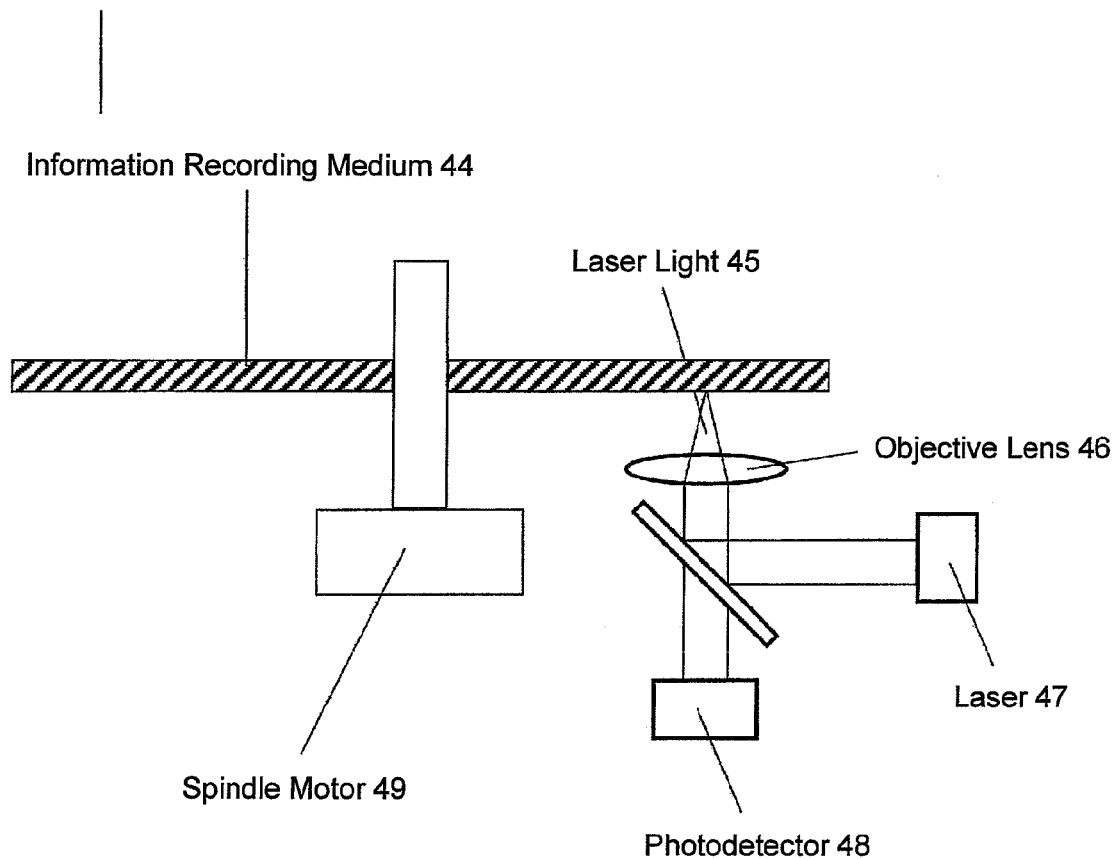
FIG. 4 is a diagram schematically illustrating part of the configuration of a recording/reproducing device used in the recording/reproduction of an optical information recording medium according to the present invention.

FIG. 4 shows an exemplary outline of a device used for recording/reproduction in the case where the information recording medium is an optical disk. An optical head (not shown) that integrates a laser 47 and an objective lens 46, a driving device (not shown) for guiding the position of the irradiated laser light to a predetermined position, a tracking control device and focusing control device (not shown) for controlling the position in the track direction and the direction perpendicular to the film surface, a laser driving device (not shown) for modulating the laser power, and a spindle motor 49 for rotating the medium are used in the recording/reproduction of signals.

The recording and reproduction of signals is carried out by first rotating the medium using the spindle motor 49, and irradiating that laser light onto the medium, concentrating a minute spot of laser light using the optical system. The power level used when reproducing signals is lower than that used when recording signals, and thus the optical states of the recording marks are not affected by laser irradiation at that power level. Meanwhile, a laser beam of a power level that can obtain a light amount sufficient for reproducing the recording marks on the medium is irradiated during this irradiation, and the signal obtained from the medium can therefore be read by a photodetector 48.

WORKING EXAMPLES

Next, the present invention shall be described in detail using working examples.

Working Example 1

In Working Example 1, the effects on recording sensitivity, reliability, and the dependence thereof on the composition when a material that exhibits a eutectic reaction with $TeO_2$ was added to a Te—O—Pd recording material was explored. Information recording media in which the various materials had been added were manufactured and evaluated, and the details thereof are indicated below.

First, the manufacturing method of the information recording medium 1 having the layer configuration illustrated in FIG. 1 shall be described.

A polycarbonate resin was used as the substrate. The substrate was 12 cm in diameter and 1.1 mm thick, with a groove pitch of 0.32 μm and a groove depth of 20 nm. The various layers were formed, through sputtering, upon the surface of the substrate on the side on which the grooves were formed, in the order described below. A 40 nm-thick AgPdCu reflective layer was formed using an AgPdCu target (weight ratio 98.1: 0.9:1.0); a 20 nm-thick $ZrO_2$—$SiO_2$—$Cr_2O_3$—$LaF_3$ dielectric layer was formed using an $ZrO_2$—$SiO_2$—$Cr_2O_3$—$LaF_3$ target (molecular number ratio 23:23:31:23); a 24 nm-thick recording layer composed of Te—O—Pd or Te—O—Pd+ added material was formed using a Te—O—Pd or a Te—O—Pd+ added material target; and a 10 nm-thick ZnS—$SiO_2$ dielectric layer was formed using a ZnS—$SiO_2$ target (molecular number ratio 80:20).

A target approximately 100 mm in diameter and 6 mm thick was used in the formation of each layer; the reflective layer was formed with a 200 W DC power source, the dielectric layers were formed with a 300 W RF power source, and the recording layer was formed with a 100 W RF power source. Furthermore, the reflective layer was formed with Ar (25 sccm) gas, the recording layer was formed with a mixture of Ar (25 seem) gas and a moderate amount of oxygen, and the dielectric layers were formed with Ar (25 sccm) gas, the formation taking place in an atmosphere where the pressure of the gasses was held at approximately 0.13 Pa. A 100 μm-thick light transparent layer was then formed upon this surface using an ultraviolet ray-curable resin that allows laser light to pass through. With respect to the information recording media that include the various added materials, the recording layers were formed using sputtering targets that differ for each of the added materials (compositions). The information recording medium 1 was manufactured in this manner.

Next, the method for evaluating the information recording medium shall be described. The recording sensitivity of the information recording medium 1 was evaluated based on the recording power at which an optimum jitter value for random signals is exhibited. To record information onto the information recording medium 1, an information recording system with a general configuration was used; the system includes the spindle motor 49, which rotates the information recording medium 1, an optical head provided with a semiconductor laser that emits laser light 45, and an objective lens that condenses the laser light 45 upon the recording layer of the information recording medium 1. For the evaluation of the information recording medium 1, the semiconductor laser used had a wavelength of 405 nm, and the numerical aperture of the objective lens was 0.85; recording equivalent to 25 GB of information was performed. The linear velocity at which the information recording medium was rotated was 4.92 m/s (36 Mbps), 9.84 m/s (72 Mbps), and 19.68 m/s (144 Mbps). Finally, a time interval analyzer was used to measure the jitter value.

The recording sensitivity was evaluated using the following procedure. Using the abovementioned system, laser light was irradiated onto the information recording medium 1 while modulating the light between a high power level, or a peak power, and a low power level, or a bias power, and the average jitter was measured after recording a random signal from 2T to 8T in mark length once on the groove surface of the recording layer. First, the ratio of bias power to peak power was fixed at a constant value, and the average jitter value was measured for various recording conditions having differing peak powers; the peak power with the minimum average jitter value was then found. Next, the ratio of bias power to peak power was altered and the same measurement performed, whereupon the peak power value at which the jitter value was minimum was determined as the recording sensitivity. With respect to the BD standard, it is desirable for the recording sensitivity obtained to be no greater than 6 mW at 1× speed (36 Mbps), no greater than 7 mW at 2× speed (72 Mbps), and no greater than 10 mW at 4× speed (144 Mbps).

The reliability was evaluated using the following procedure. First, the recording sensitivity was determined in the manner described above using the stated system. Five tracks were recorded onto empty tracks in succession at the determined recording power (Pp1), and were also recorded at 1.15 times the recording power Pp1 (Pp2). The jitter in the central track for both cases was measured using a time interval analyzer. Next, an accelerated test was performed in which the disks onto which data had been recorded were held for 200 hours in an environment with a temperature of 85 degrees and a relative humidity of 85%. Following the accelerated test, the tracks recorded at recording powers Pp1 and Pp2 were reproduced and the jitter thereof measured. Less than 1% degradation in jitter was judged to be good, 1% to less than 2% degradation was judged to be fair, and 2% or more degradation was judged to be poor. The recording was carried out at 4× speed (144 Mbps). Next, the method for measuring the elemental ratios within the recording layer shall be described. The ratio of elements within the recording layer of the information recording medium was measured by creating a sample for compositional analysis. To be more specific, each recording material was formed, using a sputtering device, to be 500 nm thick upon a 1 mm-thick Si substrate.

Compositional analysis was then performed on the samples using an x-ray micro-analyzer. The analysis results of this method are indicated in the material compositions shown in the working example.

In order to obtain the recording material compositions indicated in Tables 2 through 13, the composition of the targets used in deposition and the amount of oxygen during deposition are adjusted as appropriate. For example, when forming a recording material having a composition of Te:Pd:TeO$_2$:Bi$_2$O$_3$=23.0:24.0:47.1:5.9 [mol %], as shown in Table 5, deposition was performed using a target having a composition of Te:Pd:Bi=66.2:22.7:11.1 [mol %].

In Working Example 1, information recording media having recording layers composed of Te—O—Pd only and recording layers composed of various additional materials (Ag$_2$O, Al$_2$O$_3$, B$_2$O$_3$, Bi$_2$O$_3$, CeO$_2$, CuO, Cu$_2$O, Ga$_2$O$_3$, In$_2$O$_3$, MoO$_3$, Nb$_2$O$_5$, VO$_2$) added to Te—O—Pd, as shown in Tables 2 through 13, were manufactured and evaluated.

TABLE 2

| Composition [mol %] | | | | Ag2O/ | Recording Power [mW] | | | Reliability | |
| --- | --- | --- | --- | --- | --- | --- | --- | --- | --- |
| Te | Pd | TeO2 | Ag2O | Teo2 | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 45.00 | 8.00 | 0.18 | 5.1 | 6.1 | 9.0 | good | good |
| 23.00 | 24.00 | 34.50 | 18.50 | 0.54 | 4.5 | 5.5 | 8.0 | good | good |
| 23.00 | 24.00 | 26.50 | 26.50 | 1.00 | 5.1 | 6.2 | 9.0 | good | good |
| 23.00 | 24.00 | 21.20 | 31.80 | 1.50 | 5.2 | 6.4 | 9.5 | fair | fair |
| 11.00 | 23.00 | 66.00 | 0.00 | 0.00 | 6.0 | 7.0 | 10.0 | fair | poor |
| 11.00 | 23.00 | 46.20 | 19.80 | 0.43 | 5.3 | 6.0 | 8.5 | good | good |

TABLE 3

| Composition [mol %] | | | | Al2O3/ | Recording Power [mW] | | | Reliability | |
| --- | --- | --- | --- | --- | --- | --- | --- | --- | --- |
| Te | Pd | TeO2 | Al2O3 | TeO2 | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 48.00 | 5.00 | 0.10 | 5.1 | 6.1 | 8.9 | good | good |
| 23.00 | 24.00 | 35.30 | 17.70 | 0.50 | 5.1 | 6.3 | 9.3 | good | good |
| 23.00 | 24.00 | 30.30 | 22.70 | 0.75 | 6.7 | 7.0 | 10.9 | fair | poor |
| 11.00 | 23.00 | 66.00 | 0.00 | 0.00 | 6.0 | 7.0 | 10.0 | fair | poor |
| 11.00 | 23.00 | 56.10 | 9.90 | 0.18 | 5.2 | 6.1 | 9.4 | good | good |

TABLE 4

| Composition [mol %] | | | | B2O3/TeO2 | Recording Power [mW] | | | Reliability | |
| --- | --- | --- | --- | --- | --- | --- | --- | --- | --- |
| Te | Pd | TeO2 | B2O3 | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 45.00 | 8.00 | 0.18 | 5.1 | 6.2 | 9.0 | good | good |
| 23.00 | 24.00 | 39.80 | 13.20 | 0.33 | 5.0 | 6.1 | 8.9 | good | good |
| 23.00 | 24.00 | 33.00 | 20.00 | 0.61 | 5.9 | 6.7 | 10.5 | fair | poor |
| 11.00 | 23.00 | 66.00 | 0.00 | 0.00 | 6.0 | 7.0 | 10.0 | fair | poor |
| 11.00 | 23.00 | 49.70 | 16.30 | 0.33 | 5.5 | 6.4 | 9.4 | good | good |

TABLE 5

| Composition [mol %] | | | | Bi2O3/TeO2 | Recording Power [mW] | | | Reliability | |
| --- | --- | --- | --- | --- | --- | --- | --- | --- | --- |
| Te | Pd | TeO2 | Bi2O3 | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 51.00 | 2.00 | 0.04 | 5.1 | 6.2 | 9.3 | good | good |
| 23.00 | 24.00 | 47.10 | 5.90 | 0.13 | 4.6 | 5.4 | 8.0 | good | good |
| 23.00 | 24.00 | 40.90 | 12.10 | 0.30 | 5.2 | 6.3 | 9.3 | good | good |
| 23.00 | 24.00 | 36.00 | 17.00 | 0.47 | 6.0 | 7.4 | 10.7 | fair | fair |
| 11.00 | 23.00 | 66.00 | 0.00 | 0.00 | 6.0 | 7.0 | 10.0 | fair | poor |
| 11.00 | 23.00 | 57.40 | 8.60 | 0.15 | 5.2 | 5.9 | 8.6 | good | good |

TABLE 6

| Composition [mol %] | | | | CeO2/TeO2 | Recording Power [mW] | | | Reliability | |
| --- | --- | --- | --- | --- | --- | --- | --- | --- | --- |
| Te | Pd | TeO2 | CeO2 | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 50.30 | 2.70 | 0.05 | 5.1 | 6.2 | 9.2 | good | good |
| 23.00 | 24.00 | 46.60 | 6.40 | 0.14 | 5.1 | 6.3 | 9.3 | good | good |
| 23.00 | 24.00 | 44.00 | 9.00 | 0.20 | 6.0 | 6.8 | 10.2 | fair | poor |
| 11.00 | 23.00 | 66.00 | 0.00 | 0.00 | 6.0 | 7.0 | 10.0 | fair | poor |
| 11.00 | 23.00 | 60.20 | 5.80 | 0.10 | 5.4 | 6.5 | 9.3 | good | good |

TABLE 7

| Composition [mol %] | | | | CuO/TeO2 | Recording Power [mW] | | | Reliability | |
| --- | --- | --- | --- | --- | --- | --- | --- | --- | --- |
| Te | Pd | TeO2 | CuO | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 48.00 | 5.00 | 0.10 | 4.9 | 5.9 | 8.5 | good | good |
| 23.00 | 24.00 | 26.50 | 26.50 | 1.00 | 5.1 | 6.1 | 8.9 | good | good |
| 23.00 | 24.00 | 21.20 | 31.80 | 1.50 | 5.2 | 6.5 | 9.3 | fair | fair |
| 11.00 | 23.00 | 66.00 | 0.00 | 0.00 | 6.0 | 7.0 | 10.0 | fair | poor |
| 11.00 | 23.00 | 53.80 | 12.20 | 0.23 | 5.2 | 6.1 | 8.6 | good | good |

TABLE 8

| Composition [mol %] | | | | Cu2O/TeO2 | Recording Power [mW] | | | Reliability | |
| --- | --- | --- | --- | --- | --- | --- | --- | --- | --- |
| Te | Pd | TeO2 | Cu2O | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 50.50 | 2.50 | 0.05 | 5.1 | 5.9 | 8.8 | good | good |
| 23.00 | 24.00 | 43.50 | 9.50 | 0.22 | 4.8 | 5.7 | 8.5 | good | good |
| 23.00 | 24.00 | 26.50 | 26.50 | 1.00 | 5.1 | 6.0 | 8.8 | good | good |
| 23.00 | 24.00 | 21.20 | 31.80 | 1.50 | 5.6 | 6.8 | 9.8 | fair | fair |
| 11.00 | 23.00 | 66.00 | 0.00 | 0.00 | 6.0 | 7.0 | 10.0 | fair | poor |
| 11.00 | 23.00 | 54.10 | 11.90 | 0.22 | 5.1 | 6.0 | 8.4 | good | good |

TABLE 9

| Composition [mol %] | | | | Ga2O3/TeO2 | Recording Power [mW] | | | Reliability | |
| --- | --- | --- | --- | --- | --- | --- | --- | --- | --- |
| Te | Pd | TeO2 | Ga2O3 | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 50.30 | 2.70 | 0.05 | 4.9 | 6.0 | 8.8 | good | good |
| 23.00 | 24.00 | 45.00 | 8.00 | 0.18 | 5.0 | 6.1 | 9.0 | good | good |
| 23.00 | 24.00 | 40.00 | 13.00 | 0.33 | 5.7 | 7.0 | 10.0 | fair | fair |
| 11.00 | 23.00 | 66.00 | 0.00 | 0.00 | 6.0 | 7.0 | 10.0 | fair | poor |
| 11.00 | 23.00 | 59.40 | 6.60 | 0.11 | 5.4 | 6.2 | 8.8 | good | good |

TABLE 10

| Composition [mol %] | | | | In2O3/ TeO2 | Recording Power [mW] | | | Reliability | |
|---|---|---|---|---|---|---|---|---|---|
| Te | Pd | TeO2 | In2O3 | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 52.00 | 1.00 | 0.02 | 4.8 | 6.0 | 8.7 | good | good |
| 23.00 | 24.00 | 49.00 | 4.00 | 0.08 | 5.0 | 6.1 | 8.9 | good | good |
| 23.00 | 24.00 | 45.00 | 8.00 | 0.18 | 5.8 | 7.1 | 10.1 | fair | fair |
| 11.00 | 23.00 | 66.00 | 0.00 | 0.00 | 6.0 | 7.0 | 10.0 | fair | poor |
| 11.00 | 23.00 | 62.70 | 3.30 | 0.05 | 5.3 | 6.1 | 8.8 | good | good |

TABLE 11

| Composition [mol %] | | | | MoO3/ TeO2 | Recording Power [mW] | | | Reliability | |
|---|---|---|---|---|---|---|---|---|---|
| Te | Pd | TeO2 | MoO3 | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 42.50 | 10.50 | 0.25 | 4.3 | 6.0 | 8.6 | good | good |
| 23.00 | 24.00 | 24.10 | 28.90 | 1.20 | 3.7 | 5.4 | 7.4 | good | good |
| 23.00 | 24.00 | 21.20 | 31.80 | 1.50 | 4.4 | 6.1 | 8.8 | good | good |
| 23.00 | 24.00 | 8.00 | 45.00 | 5.63 | 5.5 | 6.7 | 9.8 | fair | fair |
| 11.00 | 23.00 | 66.00 | 0.00 | 0.00 | 6.0 | 7.0 | 10.0 | fair | poor |
| 11.00 | 23.00 | 44.50 | 21.50 | 0.48 | 5.3 | 6.1 | 8.6 | good | good |

TABLE 12

| Composition [mol %] | | | | Nb2O5/ TeO2 | Recording Power [mW] | | | Reliability | |
|---|---|---|---|---|---|---|---|---|---|
| Te | Pd | TeO2 | Nb2O5 | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 50.50 | 2.50 | 0.05 | 4.9 | 5.9 | 8.7 | good | good |
| 23.00 | 24.00 | 47.20 | 5.80 | 0.12 | 5.1 | 6.1 | 9.0 | good | good |
| 23.00 | 24.00 | 42.40 | 10.60 | 0.25 | 5.6 | 7.0 | 10.2 | fair | fair |
| 11.00 | 23.00 | 66.00 | 0.00 | 0.00 | 6.0 | 7.0 | 10.0 | fair | poor |
| 11.00 | 23.00 | 60.30 | 5.70 | 0.09 | 5.6 | 5.8 | 8.6 | good | good |

TABLE 13

| Composition [mol %] | | | | VO2/TeO2 | Recording Power [mW] | | | Reliability | |
|---|---|---|---|---|---|---|---|---|---|
| Te | Pd | TeO2 | VO2 | | 1x | 2x | 4x | Pp1 | Pp2 |
| 23.00 | 24.00 | 53.00 | 0.00 | 0.00 | 5.3 | 6.5 | 9.5 | good | fair |
| 23.00 | 24.00 | 48.00 | 5.00 | 0.10 | 4.9 | 6.0 | 8.9 | good | good |
| 23.00 | 24.00 | 40.00 | 13.00 | 0.33 | 5.0 | 6.1 | 9.0 | good | good |
| 23.00 | 24.00 | 26.50 | 26.50 | 1.00 | 5.6 | 6.8 | 10.1 | fair | fair |
| 11.00 | 23.00 | 66.00 | 0.00 | 0.00 | 6.0 | 7.0 | 10.0 | fair | poor |
| 11.00 | 23.00 | 54.10 | 11.90 | 0.22 | 5.4 | 6.2 | 8.8 | good | good |

As indicated in Table 2, with an information recording medium that has a recording layer composed only of Te—O—Pd, the recording sensitivity and reliability results differ depending on the composition. With the composition Te:Pd:TeO$_2$=23.0:24.0:53.0 [mol %], the recording sensitivity achieved the desired value at 1×, 2×, and 4×, but there were issues with reliability. With recording marks recorded at +15% power, the jitter degraded 1% or more and less than 2% following the accelerated test. Next, with the composition Te:Pd:TeO$_2$=11.0:23.0:66.0 [mol %], the recording sensitivity managed to achieve the desired value, but with respect to reliability, a degradation in jitter of 1% or more and less than 2% at Pp1 and 2% or more at Pp2 was observed. The drop in sensitivity and reliability issues are thought to have resulted from the increased TeO$_2$ amount, particularly in the latter composition.

As opposed to this, the results of adding the various additional materials in order to improve the recording sensitivity are indicated in Tables 2 through 13.

Although the optimum added amounts and influence upon recording sensitivity and reliability differ due to differences in the changes in melting points when adding each material, it was observed that fulfilling the following compositional ratios of additional material to TeO$_2$ resulted in improvements in the recording sensitivity (at both 1× and 2× speeds) and the reliability: when the material A is Ag$_2$O, the Ag$_2$O/TeO$_2$ ratio is no less than 0.18 and no more than 1.00; when the material A is Al$_2$O$_3$, the Al$_2$O$_3$/TeO$_2$ ratio is no less than 0.10 and no more than 0.50; when the material A is B$_2$O$_3$, the B$_2$O$_3$/TeO$_2$ ratio is no less than 0.18 and no more than 0.33; when the material A is Bi$_2$O$_3$, the Bi$_2$O$_3$/TeO$_2$ ratio is no less than 0.04 and no more than 0.30; when the material A is CeO$_2$, the CeO$_2$/TeO$_2$ ratio is no less than 0.05 and no more than 0.14; when the material A is CuO, the CuO/TeO$_2$ ratio is no less than 0.10 and no more than 1.00; when the material A is Cu$_2$O, the Cu$_2$O/TeO$_2$ ratio is no less than 0.05 and no more than 1.00; when the material A is Ga$_2$O$_3$, the Ga$_2$O$_3$/TeO$_2$ ratio is no less than 0.05 and no more than 0.18; when the material A is In$_2$O$_3$, the In$_2$O$_3$/TeO$_2$ ratio is no less than 0.02 and no more than 0.08; when the material A is MoO$_3$, the MoO$_3$/TeO$_2$ ratio is no less than 0.25 and no more than 1.50; when the material A is Nb$_2$O$_5$, the Nb$_2$O$_5$/TeO$_2$ ratio is no less than 0.05 and no more than 0.12; and when the material A is VO$_2$, the VO$_2$/TeO$_2$ ratio is no less than 0.10 and no more than 0.33. In addition, a better jitter value compared to the case where the additional material is not added was obtained.

Working Example 2

In this example, a recording layer material according to the present invention (Te—Pd—TeO$_2$—Bi$_2$O$_3$ is used as a representative example here) was applied to a dual-layer information recording medium, and the influence thereof upon the recording sensitivity and reliability was explored.

An information recording medium having the layer configuration shown in FIG. 2 was manufactured. A polycarbonate resin was used as the substrate. The substrate was 12 cm in diameter and 1.1 mm thick, with a groove pitch of 0.32 μm and a groove depth of 20 nm.

The layers mentioned hereinafter were formed through sputtering, as the first information layer, upon the surface of the substrate on the side on which the grooves were formed, in the order described: a 40 nm-thick AgPdCu reflective layer was formed using an AgPdCu target (weight ratio 98.1:0.9:1.0); a 20 nm-thick ZrO$_2$—SiO$_2$—Cr$_2$O$_3$—LaF$_3$ dielectric layer was formed using an ZrO$_2$—SiO$_2$—Cr$_2$O$_3$—LaF$_3$ target (molecular number ratio 23:23:31:23); a 20 nm-thick recording layer composed of Te—O—Pd or Te—O—Pd—Bi$_2$O$_3$ was formed using a Te—O—Pd or a Te—O—Pd—Bi$_2$O$_3$ target; and a 20 nm-thick ZnS—SiO$_2$ dielectric layer was formed using a ZnS—SiO$_2$ target (molecular number ratio 80:20). A pitted pattern identical to that of the substrate was transferred onto the surface of this first information layer using an ultraviolet ray-curable resin, and an approximately 25 μm-thick intermediate layer was formed.

Next, the layers mentioned hereinafter were formed through sputtering, as the second information layer, upon the surface of the intermediate layer, in the order described: a 10 nm-thick AgPdCu reflective layer was formed using an AgPdCu target (weight ratio 98.1:0.9:1.0); a 13 nm-thick $ZrO_2$—$SiO_2$—$Cr_2O_3$—$LaF_3$ dielectric layer was formed using an $ZrO_2$—$SiO_2$—$Cr_2O_3$—$LaF_3$ target (molecular number ratio 23:23:31:23); a 10 nm-thick recording layer composed of Te—O—Pd or Te—O—Pd—$Bi_2O_3$ was formed using a Te—O—Pd or a Te—O—Pd—$Bi_2O_3$ target (molecular number ratio 37:53:10); and a 25 nm-thick ZnS—$SiO_2$ dielectric layer was formed using a ZnS—$SiO_2$ target (molecular number ratio 80:20). A pitted pattern identical to that of the substrate was transferred onto the surface of this second information layer using an ultraviolet ray-curable resin, and an approximately 25 μm-thick intermediate layer was formed.

A target approximately 100 mm in diameter and 6 mm thick was used in the formation of each layer; the reflective layer was formed with a 200 W DC power source, the dielectric layers were formed with a 300 W RF power source, and the recording layer was formed with a 100 W RF power source. Furthermore, the reflective layer was formed with Ar (25 sccm) gas, the recording layer was formed with a mixture of Ar (25 sccm) gas and a moderate amount of oxygen, and the dielectric layers were formed with Ar (25 seem) gas, the formation taking place in an atmosphere where the pressure of the gasses was held at approximately 0.13 Pa.

The methods for analyzing the recording layer compositions and evaluating the recording sensitivities and reliabilities were the same as those described in Working Example 1. Note that in the case of a dual-layer information recording medium, with respect to the BD standard, it is desirable for the recording sensitivity obtained to be no greater than 12 mW at 1× speed (36 Mbps), no greater than 14 mW at 2× speed (72 Mbps), and no greater than 18 mW at 4× speed (144 Mbps).

In Working Example 2, information recording media having recording layers composed of Te—O—Pd only and information recording media having recording layers composed of $Bi_2O_3$ added to Te—O—Pd, as shown in Table 14, were manufactured and evaluated in the abovementioned manner.

TABLE 14

| Composition [mol %] | | | | | | Recording Power [mW] | | | Reliability | |
|---|---|---|---|---|---|---|---|---|---|---|
| Te | Pd | TeO2 | Bi2O3 | Bi2O3/TeO2 | Information Layer | 1× | 2× | 4× | Pp1 | Pp2 |
| 23.0 | 24.0 | 53.0 | 0.0 | 0.00 | First Information Layer | 10.2 | 13.6 | 18.3 | good | fair |
|  |  |  |  |  | Second Information Layer | 8.0 | 10.5 | 14.6 | good | fair |
| 23.0 | 24.0 | 46.1 | 6.9 | 0.15 | First Information Layer | 8.7 | 11.6 | 15.6 | good | good |
|  |  |  |  |  | Second Information Layer | 6.8 | 8.9 | 12.4 | good | good |

As indicated in Table 14, the following results were obtained with the information recording medium having recording layers composed of Te—O—Pd only. The recording sensitivity of the first information layer achieves the desired value at 1× and 2× speeds, but does not achieve the desired value at 4× speed, and thus issues with regards to recording sensitivity were observed. With respect to reliability, recording marks recorded at +15% power resulted in a degradation in jitter of 1% or more and less than 2% following the accelerated test, and thus issues with regards to reliability were observed as well. The recording sensitivity of the second information layer achieves the desired value at 1×, 2×, and 4× speeds. However, with respect to reliability, recording marks recorded at +15% power resulted in a degradation in jitter of 1% or more and less than 2% following the accelerated test, and thus issues with regards to reliability were observed there as well.

As opposed to this, when $Bi_2O_3$ was added in order to improve the recording sensitivity, both the first and second information layers exceeded the desired recording sensitivity value at 1×, 2×, and 4× speeds, and furthermore, the reliability was favorable at both Pp1 and Pp2. In addition, a better jitter value compared to the case where the additional material is not added was obtained in all information layers. Similar results were also confirmed when additional materials aside from $Bi_2O_3$, as mentioned in Working Example 1, were added.

Based on this, it was observed that applying $Bi_2O_3$+ the material A (where the material A is a material that exhibits a eutectic reaction with Te—O) to the recording layers in a dual-layer information recording medium improves both the recording sensitivity and the reliability.

Working Example 3

In this example, a recording layer material according to the present invention (Te—O—Pd—$Bi_2O_3$ is used as a representative example here) was applied to a four-layer information recording medium, and the influence thereof upon the recording sensitivity and reliability was explored.

An information recording medium having the layer configuration shown in FIG. 3 (where n is 4) was manufactured. A polycarbonate resin was used as the substrate. The substrate was 12 cm in diameter and 1.1 mm thick, with a groove pitch of 0.32 μm and a groove depth of 20 nm.

The layers mentioned hereinafter were formed through sputtering, as the first information layer, upon the surface of the substrate on the side on which the grooves were formed, in the order described: an 80 nm-thick AgPdCu reflective layer was formed using an AgPdCu target (weight ratio 98.1:0.9:1.0); a 20 nm-thick $ZrO_2$—$SiO_2$—$Cr_2O_3$—$LaF_3$ dielectric layer was formed using an $ZrO_2$—$SiO_2$—$Cr_2O_3$—$LaF_3$ target (molecular number ratio 23:23:31:23); a 20 nm-thick recording layer composed of Te—O—Pd or Te—O—Pd—$Bi_2O_3$ was formed using a Te—O—Pd or a Te—O—Pd—$Bi_2O_3$ target; and a 30 nm-thick ZnS—$SiO_2$ dielectric layer was formed using a ZnS—$SiO_2$ target (molecular number ratio 80:20). A pitted pattern identical to that of the substrate was transferred onto the surface of this first information layer using an ultraviolet ray-curable resin, and an approximately 13.5 μm-thick intermediate layer was formed.

Next, the layers mentioned hereinafter were formed through sputtering, as the second information layer, upon the surface of that intermediate layer, in the order described: an 8 nm-thick AlN dielectric layer was formed using an AlN target; a 6 nm-thick Te—O—Pd or Te—O—Pd—$Bi_2O_3$ recording layer was formed using a Te—O—Pd or a Te—O—Pd—Bi$_2$O$_3$ target; and a 27 nm-thick ZnS dielectric layer was formed using a ZnS target. A pitted pattern identical to that of the substrate was transferred onto the surface thereof using an ultraviolet ray-curable resin, and a 17.5 μm-thick intermediate layer was formed.

Next, the layers mentioned hereinafter were formed through sputtering, as the third information layer, upon the surface of that intermediate layer, in the order described: a 12 mm-thick AlN dielectric layer was formed using an AlN target; a 6 nm-thick Te—O—Pd or Te—O—Pd—Bi$_2$O$_3$ recording layer was formed using a Te—O—Pd or a Te—O—Pd—Bi$_2$O$_3$ target; and a 38 nm-thick ZnS—SiO$_2$ dielectric layer was formed using a ZnS—SiO$_2$ target (molecular number ratio 80:20). A pitted pattern identical to that of the substrate was transferred onto the surface thereof using an ultraviolet ray-curable resin, and a 9.5 μm-thick intermediate layer was formed.

Next, the layers mentioned hereinafter were formed through sputtering, as the fourth information layer, upon the surface of that intermediate layer, in the order described: a 15 nm-thick AlN dielectric layer was formed using an AlN target; a 6 nm-thick Te—O—Pd or Te—O—Pd—Bi$_2$O$_3$ recording layer was formed using a Te—O—Pd or a Te—O—Pd—Bi$_2$O$_3$ target; and a 46 nm-thick ZnS—SiO$_2$ dielectric layer was formed using a ZnS—SiO$_2$ target (molecular number ratio 80:20). A 59.5 μm-thick light transparent layer was formed on the surface of this information layer using an ultraviolet ray-curable resin.

A target approximately 100 mm in diameter and 6 mm thick was used in the formation of each layer; the reflective layer was formed with a 200 W DC power source, the dielectric layers were formed with a 300 W RF power source, and the recording layer was formed with a 100 W RF power source. Furthermore, the reflective layer was formed with Ar (25 sccm) gas, the recording layer was formed with a mixture of Ar (25 sccm) gas and a moderate amount of oxygen, and the dielectric layers were formed with Ar (25 sccm) gas, the formation taking place in an atmosphere where the pressure of the gasses was held at approximately 0.13 Pa.

The methods for analyzing the recording layer compositions and evaluating the recording sensitivities and reliabilities were the same as those described in Working Example 1.

Note that in the case of a four-layer information recording medium, it is desirable for the recording sensitivity obtained to be no greater than 13 mW at 1× speed (36 Mbps) and no greater than 17 mW at 2× speed (72 Mbps).

In Working Example 3, information recording media having recording layers composed of Te—O—Pd only and information recording media having recording layers composed of Bi$_2$O$_3$ added to Te—O—Pd, as shown in Table 15, were manufactured and evaluated in the abovementioned manner.

TABLE 15

| Composition [mol %] | | | | | | Recording Power [mW] | | Reliability | |
|---|---|---|---|---|---|---|---|---|---|
| Te | Pd | TeO2 | Bi2O3 | Bi2O3/TeO2 | Layer | 1× | 2× | Pp1 | Pp2 |
| 23.0 | 24.0 | 53.0 | 0.0 | 0.00 | First Information Layer | 14.0 | 17.5 | good | fair |
| | | | | | Second Information Layer | 12.0 | 17.0 | good | fair |
| | | | | | Third Information Layer | 13.0 | 18.0 | good | fair |
| | | | | | Fourth Information Layer | 11.5 | 13.5 | good | fair |
| 23.0 | 24.0 | 46.1 | 6.9 | 0.15 | First Information Layer | 11.9 | 14.9 | good | good |
| | | | | | Second Information Layer | 10.2 | 14.5 | good | good |
| | | | | | Third Information Layer | 11.1 | 15.3 | good | good |
| | | | | | Fourth Information Layer | 9.8 | 11.5 | good | good |

As indicated in Table 15, the following results were obtained with the information recording medium having recording layers composed of Te—O—Pd only. At 1× speed, only the first information layer did not meet the target value, whereas at 2× speed, the first and third information layers could not achieve the target values. With respect to reliability, recording marks recorded at +15% power resulted in a degradation in jitter of 1% or more and less than 2% in all information layers following the accelerated test, and thus issues with regards to reliability were observed there as well.

As opposed to this, when Bi$_2$O$_3$ was added in order to improve the recording sensitivity, all information layers exceeded the desired recording sensitivity value at 1×, and 2× speeds, and furthermore, the reliability was favorable at both Pp1 and Pp2. In addition, a better jitter value compared to the case where the additional material is not added was obtained in all information layers. Similar results were also confirmed when additional materials aside from Bi$_2$O$_3$, as mentioned in Working Example 1, were added.

Based on this, it was observed that applying TeOPd+ the material A (where the material A is a material that exhibits a eutectic reaction with Te—O) to the recording layers in a four-layer information recording medium improves both the recording sensitivity and the reliability.

INDUSTRIAL APPLICABILITY

The information recording medium and manufacturing method thereof according to the present invention are useful in large-capacity write-once optical information recording media, such as DVD-R disks, BD-Rs, and so on.

The invention claimed is:

1. An information recording medium having a recording layer on a substrate, the information recording medium to which information can be recorded and from which information can be reproduced by irradiating the recording layer with laser light or applying electrical energy to the recording layer,
wherein the recording layer contains Te, M (where M is one or more elements selected from Au, Pd, and Pt), $TeO_2$ and a material A as its primary component;
the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and
the material A is $Ag_2O$, and the $Ag_2O/TeO_2$ ratio is no less than 0.18 and no more than 1.00.

2. An information recording medium having a recording layer on a substrate, the information recording medium to which information can be recorded and from which information can be reproduced by irradiating the recording layer with laser light or applying electrical energy to the recording layer,
wherein the recording layer contains Te, M (where M is one or more elements selected from Au, Pd, and Pt), $TeO_2$ and a material A as its primary component;
the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and
the material A is $Al_2O_3$, and the $Al_2O_3/TeO_2$ ratio is no less than 0.10 and no more than 0.50.

3. An information recording medium having a recording layer on a substrate, the information recording medium to which information can be recorded and from which information can be reproduced by irradiating the recording layer with laser light or applying electrical energy to the recording layer,
wherein the recording layer contains Te, M (where M is one or more elements selected from Au, Pd, and Pt), $TeO_2$ and a material A as its primary component;
the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and
the material A is $B_2O_3$, and the $B_2O_3/TeO_2$ ratio is no less than 0.18 and no more than 0.33.

4. An information recording medium having a recording layer on a substrate, the information recording medium to which information can be recorded and from which information can be reproduced by irradiating the recording layer with laser light or applying electrical energy to the recording layer,
wherein the recording layer contains Te, M (where M is one or more elements selected from Au, Pd, and Pt), $TeO_2$ and a material A as its primary component;
the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and
the material A is $Bi_2O_3$, and the $Bi_2O_3/TeO_2$ ratio is no less than 0.04 and no more than 0.30.

5. An information recording medium having a recording layer on a substrate, the information recording medium to which information can be recorded and from which information can be reproduced by irradiating the recording layer with laser light or applying electrical energy to the recording layer,
wherein the recording layer contains Te, M (where M is one or more elements selected from Au, Pd, and Pt), $TeO_2$ and a material A as its primary component;
the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and
the material A is $CeO_2$, and the $CeO_2/TeO_2$ ratio is no less than 0.05 and no more than 0.14.

6. An information recording medium having a recording layer on a substrate, the information recording medium to which information can be recorded and from which information can be reproduced by irradiating the recording layer with laser light or applying electrical energy to the recording layer,
wherein the recording layer contains Te, M (where M is one or more elements selected from Au, Pd, and Pt), $TeO_2$ and a material A as its primary component;
the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and
the material A is CuO, and the $CuO/TeO_2$ ratio is no less than 0.10 and no more than 1.00.

7. An information recording medium having a recording layer on a substrate, the information recording medium to which information can be recorded and from which information can be reproduced by irradiating the recording layer with laser light or applying electrical energy to the recording layer,
wherein the recording layer contains Te, M (where M is one or more elements selected from Au, Pd, and Pt), $TeO_2$ and a material A as its primary component;
the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and
the material A is $Cu_2O$, and the $Cu_2O/TeO_2$ ratio is no less than 0.05 and no more than 1.00.

8. An information recording medium having a recording layer on a substrate, the information recording medium to which information can be recorded and from which information can be reproduced by irradiating the recording layer with laser light or applying electrical energy to the recording layer,
wherein the recording layer contains Te, M (where M is one or more elements selected from Au, Pd, and Pt), $TeO_2$ and a material A as its primary component;
the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and
the material A is $Ga_2O_3$, and the $Ga_2O_3/TeO_2$ ratio is no less than 0.05 and no more than 0.18.

9. An information recording medium having a recording layer on a substrate, the information recording medium to which information can be recorded and from which information can be reproduced by irradiating the recording layer with laser light or applying electrical energy to the recording layer, wherein the recording layer contains Te, M (where M is one or more elements selected from Au, Pd, and Pt), $TeO_2$ and a material A as its primary component;

the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and the material A is $In_2O_3$, and the $In_2O_3/TeO_2$ ratio is no less than 0.02 and no more than 0.08.

10. An information recording medium having a recording layer on a substrate, the information recording medium to which information can be recorded and from which information can be reproduced by irradiating the recording layer with laser light or applying electrical energy to the recording layer, wherein the recording layer contains Te, M (where M is one or more elements selected from Au, Pd, and Pt), $TeO_2$ and a material A as its primary component;

the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and the material A is $Nb_2O_5$, and the $Nb_2O_5/TeO_2$ ratio is no less than 0.05 and no more than 0.12.

11. An information recording medium having a recording layer on a substrate, the information recording medium to which information can be recorded and from which information can be reproduced by irradiating the recording layer with laser light or applying electrical energy to the recording layer, wherein the recording layer contains Te, M (where M is one or more elements selected from Au, Pd, and Pt), $TeO_2$ and a material A as its primary component;

the percentage of content of Te atoms is no less than 0 mol % and no more than 40 mol %, the percentage of content of M atoms is no less than 0 mol % and no more than 40 mol %, and the percentage of content of $TeO_2$ + the material A is no less than 40 mol % and no more than 85 mol %; and the material A is $VO_2$, and the $VO_2/TeO_2$ ratio is no less than 0.10 and no more than 0.33.

12. The information recording medium according to claim 1, wherein the thickness of the recording layer is no less than 2 nm and less than 30 nm.

13. The information recording medium according to claim 1, comprising n information layers (where n is an integer of 2 or more) formed upon the substrate and interspersed with separating layers, wherein at least one of the information layers has the recording layer.

14. A manufacturing method for the information recording medium according to claim 1, comprising a step of creating a recording layer on a substrate, for manufacturing an information recording medium to which information can be recorded and from which information can be reproduced by irradiating the recording layer with laser light or applying electrical energy to the recording layer, wherein the recording layer is manufactured through sputtering; and the target material used in the step of manufacturing the recording layer has, as its primary component, a mixture of Te—O—M (where M is one or more elements selected from Au, Pd, and Pt) and a material A (where the material A is a material that exhibits a eutectic reaction with Te—O).

15. A manufacturing method for the information recording medium according to claim 1, comprising a step of creating a recording layer on a substrate, for manufacturing an information recording medium to which information can be recorded and from which information can be reproduced by irradiating the recording layer with laser light or applying electrical energy to the recording layer, wherein the recording layer is manufactured through sputtering;

the target material used in the step of manufacturing the recording layer has, as its primary component, a mixture of Te—M (where M is one or more elements selected from Au, Pd, and Pt) and a material B (where the material A, which is an oxide of the material B, is a material that exhibits a eutectic reaction with Te—O); and the deposition gas has, as its primary component, a mixture of a rare gas and oxygen, and reactive sputtering is performed.

16. A manufacturing method for the information recording medium according to claim 1, comprising a step of creating a recording layer on a substrate, for manufacturing an information recording medium to which information can be recorded and from which information can be reproduced by irradiating the recording layer with laser light or applying electrical energy to the recording layer, wherein the recording layer is manufactured through sputtering; and in the step of manufacturing the recording layer, a compound of Te—M (where M is one or more elements selected from Au, Pd, and Pt), Te—O, and the material A (where the material A is a material that exhibits a eutectic reaction with Te—O) are sputtered from differing targets simultaneously.

17. A sputtering target used during the formation of a recording layer of the information recording medium according to claim 1, wherein the sputtering target has, as its primary components, $TeO_2$ and a material A; and the material A is a material that exhibits a eutectic reaction with $TeO_2$.

18. A sputtering target used during the formation of a recording layer of the information recording medium according to claim 1, wherein the sputtering target has, as its primary components, $TeO_2$ and a material B; and an oxide of the material B is a material that exhibits a eutectic reaction with $TeO_2$.

* * * * *